(12) United States Patent
Shih et al.

(10) Patent No.: US 9,210,801 B2
(45) Date of Patent: Dec. 8, 2015

(54) DISPLAY PANEL AND WIRING STRUCTURE THEREOF

(71) Applicant: Shenzhen China Star Optoelectronics Technology Co., Ltd., Shenzhen, Guangdong (CN)

(72) Inventors: Ming-hung Shih, Shenzhen (CN); Zuomin Liao, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 585 days.

(21) Appl. No.: 13/805,716

(22) PCT Filed: Dec. 14, 2012

(86) PCT No.: PCT/CN2012/086649
§ 371 (c)(1),
(2) Date: Dec. 20, 2012

(87) PCT Pub. No.: WO2014/089823
PCT Pub. Date: Jun. 19, 2014

(65) Prior Publication Data
US 2014/0158401 A1    Jun. 12, 2014

(30) Foreign Application Priority Data

Dec. 12, 2012 (CN) .......................... 2012 1 0535087

(51) Int. Cl.
*G02F 1/1343* (2006.01)
*H05K 1/02* (2006.01)

(52) U.S. Cl.
CPC ...... *H05K 1/025* (2013.01); *H05K 2201/09227* (2013.01); *H05K 2201/09727* (2013.01)

(58) Field of Classification Search
CPC ................... G02F 1/136286; G02F 1/133707; G02F 1/134336; G02F 1/134363; G02F 1/1345; G02F 1/134327; G02F 1/134309; G02F 1/1393
USPC ......................................... 349/139, 142, 143
See application file for complete search history.

(56) References Cited

U.S. PATENT DOCUMENTS

| | | | | |
|---|---|---|---|---|
| 5,739,880 A | * | 4/1998 | Suzuki | G02F 1/133512 349/110 |
| 2003/0095224 A1 | * | 5/2003 | Asakura | G02F 1/1345 349/143 |
| 2015/0077656 A1 | * | 3/2015 | Ito | G06F 3/0412 349/12 |

* cited by examiner

*Primary Examiner* — Mike Qi
(74) *Attorney, Agent, or Firm* — Andrew C. Cheng

(57) ABSTRACT

The present invention provides a display panel and a wiring structure thereof. The wiring structure comprises a plurality of metal wires extending across a first wiring region, a second wiring region, and a third wiring region. The first wiring region adjoins the second wiring region. The second wiring region adjoins the third wiring region. A line width of an nth metal wire in the second wiring region is a, and a distance between the nth metal wire and an n+1th metal wire is b, where n≥1. When n is taken as different values, a/(a+b) is a constant value. According to the above method, the coverage ratio in the seal coating region by the metal wires is not changed to avoid the problem of uneven curing of the sealant. The performance stability of the display panel is thus not impacted.

20 Claims, 3 Drawing Sheets

(12)

DISPLAY PANEL AND WIRING STRUCTURE THEREOF

BACKGROUND OF THE INVENTION

1. Field of the Invention

The present invention relates to a display technology, more particularly, to a display panel and a wiring structure thereof.

2. Description of the Related Art

In order to improve display quality of display panels, the impedances between metal wires in display panels are reduced as possible. Such an objective can be achieved by changing the line widths of metal wires.

Please refer to FIG. 1, FIG. 1 is a schematic diagram showing a wiring structure of a conventional display panel. A plurality of metal wires is disposed in a seal coating region 12 of the display panel. Take an N+1th metal wire, an Nth metal wire, and an N−1th metal wire as an example, lengths of the metal wires are increased along an arrangement direction from a first metal wire to the Nth metal wire (a direction A as indicated by the arrow in FIG. 1). That means, the N+1th metal wire has a bigger length than the Nth metal wire, and the Nth metal wire has a bigger length than the N−1th metal wire. In order to reduce the impedance difference between the metal wires, line widths of the metal wires along the direction A in FIG. 1 are increased. Namely, a line width of the N+1th metal wire is bigger than a line width of the Nth metal wire, and the line width of the Nth metal wire is bigger than a line, width of the N−1th metal wire. Under the circumstances that a distance between the adjacent metal wires D remains the same value, a coverage ratio of the seal coating region 12 by the metal wires is increased along the direction A in FIG. 1 owing to the increased line width of the metal wires. Hence, the light transmittance in the seal coating region 12 varies to cause uneven curing of the sealant. As a result, the display quality of the liquid crystal panel is impacted.

SUMMARY OF THE INVENTION

The present invention provides a display panel and a wiring structure thereof so that the coverage ratio in the seal coating region by the metal wires is not changed.

The present invention provides a wiring structure of a display panel. The wiring structure comprises a plurality of metal wires extending across a first wiring region, a second wiring region, and a third wiring region. The first wiring region adjoins the second wiring region. The second wiring region adjoins the third wiring region. The first wiring region is located inside the second wiring region. The third wiring region is located outside the second wiring region. The second wiring region is a seal coating region of the display panel. A line width of an nth metal wire in the second wiring region is a, and a distance between the nth metal wire and an n+1th metal wire is b, where n≥1. When n is taken as different values, a/(a+b) is a constant value. Both the value of the line width a and the value of the distance b in the second region change in equal proportion. A percentage difference between impedance values of the two adjacent metal wires is no more than 10%.

In one aspect of the present invention, the line width a is increased along an arrangement direction from a first metal wire to a last metal wire in the first wiring region and the third wiring region as n increases, and the distance b remains the same value in the first wiring region and the third wiring region as n increases.

The present invention provides a wiring structure of a display panel. The wiring structure comprises a plurality of metal wires extending across a first wiring region, a second wiring region, and a third wiring region. The first wiring region adjoins the second wiring region. The second wiring region adjoins the third wiring region. The first wiring region is located inside the second wiring region. The third wiring region is located outside the second wiring region. The second wiring region is a seal coating region of the display panel. A line width of an nth metal wire in the second wiring region is a, and a distance between the nth metal wire and an n+1th metal wire is b, where n≥1. When n is taken as different values, a/(a+b) is a constant value.

In one aspect of the present invention, the line width a and the distance b in the second region are both constant values when n is taken as different values.

In another aspect of the present invention, both the value of the line width a and the value of the distance b in the second region change in equal proportion when n is taken as different values.

In another aspect of the present invention, both the value of the line width a and the value of the distance b increase in a first direction along which a first metal wire to a last metal wire arrange in equal proportion.

In another aspect of the present invention, the proportion is 1:1.

In another aspect of the present invention, both the value of the line width a and the value of the distance b decrease in a second direction along which a last metal wire to a first metal wire arrange in equal proportion.

In another aspect of the present invention, the proportion is 1:1.

In still another aspect of the present invention, a percentage difference between impedance values of the two adjacent metal wires is no more than 10%.

In yet another aspect of the present invention, the line width a is increased along an arrangement direction from a first metal wire to a last metal wire in the first wiring region and the third wiring region as n increases, and the distance b remains the same value in the first wiring region and the third wiring region as n increases.

The present invention further provides a display panel. The display panel comprises a wiring structure disposed in the display panel. The wiring structure comprises a plurality of metal wires extending across a first wiring region, a second wiring region, and as third wiring region. The first wiring region adjoins the second wiring region. The second wiring region adjoins the third wiring region. The first wiring region is located inside the second wiring region. The third wiring region is located outside the second wiring region. The second wiring region is a seal coating region of the display panel. A line width of an nth metal wire in the second wiring region is a, and a distance between the nth metal wire and an n+1th metal wire is b, where n≥1. When n is taken as different values, a/(a+b) is a constant value.

In one aspect of the present invention, the line width a and the distance b in the second region are both constant values when n is taken as different values.

In another aspect of the present invention, both the value of the line width a and the value of the distance b in the second region change in equal proportion when N is taken as different values.

In another aspect of the present invention, both the value of the line width a and the value of the distance b increase in a first direction along which a first metal wire to a last metal wire arrange in equal proportion.

In another aspect of the present invention, the proportion is 1:1.

In another aspect of the present invention, both the value of the line width a and the value of the distance b decrease in as second direction along which a last metal wire to a first metal wire arrange in equal proportion.

In another aspect of the present invention, the proportion is 1:1.

In still another aspect of the present invention, a percentage difference between impedance values of the two adjacent metal wires is no more than 10%.

In yet another aspect of the present invention, the line width a is increased along an arrangement direction from a first metal wire to a last metal wire in the first wiring region and the third wiring region as a increases, and the distance b remains the same value in the first wiring region and the third wiring region as n increases.

In contrast to the prior art, the present invention display panel and its wiring structure are achieved by keeping a/(a+b) a constant value, where a is the line width of each of the metal wires and b is the distance between the adjacent metal wires in the seal coating region of the display panel. Therefore, the coverage ratio in the seal coating region by the metal wires is not changed to avoid the problem of uneven curing of the sealant. As a result, the performance stability of the display panel is improved so as to effectively improve the display quality.

DESCRIPTION OF THE EMBODIMENTS

The accompanying drawings are included to provide a further understanding of the invention, and are incorporated in and constitute a part of this specification. The drawings illustrate embodiments of the invention and, together with the description, serve to explain the principles of the invention.

Figure 1:
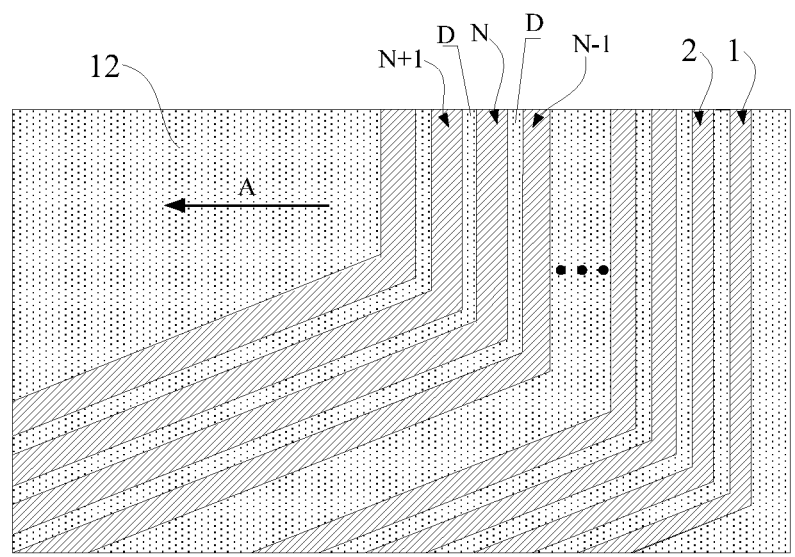
FIG. 1 is a schematic diagram showing a wiring structure of a conventional display panel.
Figure 2:
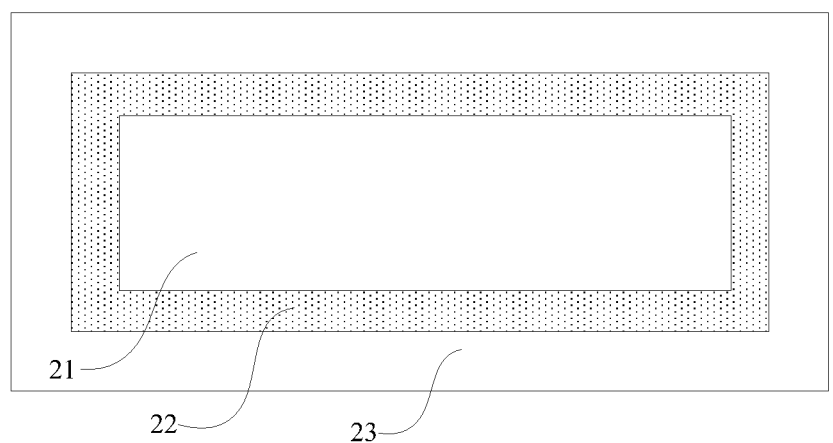
FIG. 2 is a perspective top view of a display panel according to the present invention.

Please refer to FIG. 2, FIG. 2 is a perspective top view of a display panel according to the present invention. The display panel 20 comprises a first wiring region 21, a second wiring region 22, and a third wiring region 23. The first wiring region 21 is located inside the second wiring region 22, and the third wiring region 23 is located outside the second wiring region 22. The second wiring region 22 is a seal coating region of the display panel 20.

Figure 3:
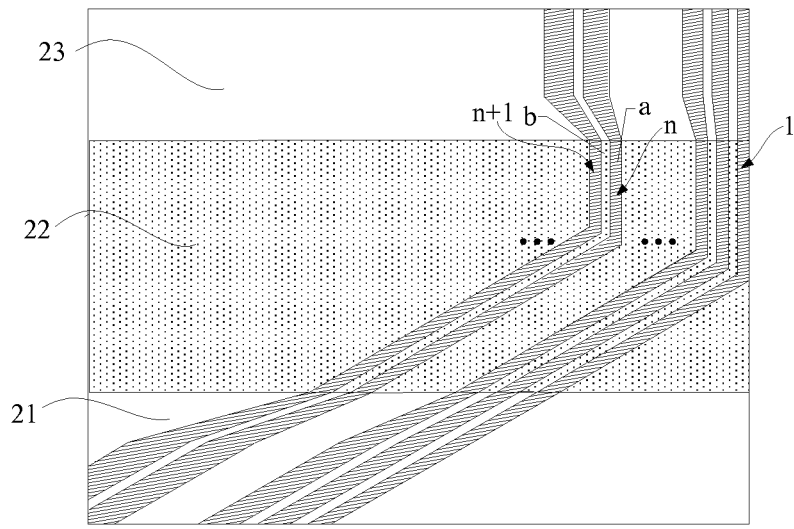
FIG. 3 is a schematic diagram showing a distribution of a wiring structure of the display panel according to the present invention.

Please also refer to FIG. 3, FIG. 3 is a schematic diagram showing a distribution of a wiring structure of the display panel according to the present invention. The display panel 20 comprises the wiring structure as shown in FIG. 3. The wiring structure comprises a plurality of metal wires. The metal wires extend across the first wiring region 21, the second wiring region 22, and the third wiring region 23. The first wiring region 21 adjoins the second wiring region 22, and the second wiring region 22 adjoins the third wiring region 23. The percentage difference between impedance values of the two adjacent metal wires extending across the first wring region 21, the second wiring region 22, and the third wiring region 23 is no more than 10%. That means, the two adjacent metal wires may have the same impedance value. Of course, the difference between the impedance values may be several ohms, or the percentage difference of impedance values may be within 10%. In other embodiments, the impedance values of the adjacent metal wires may be other values. Any specific requirements are determined according to the practical situations.

A line width of an nth metal wire in the second wiring region 22 is a, and a distance between the nth metal wire and an n+1th metal wire is b, where n≥1. When n is taken as different values, a/(a+b) is a constant value.

Figure 4:
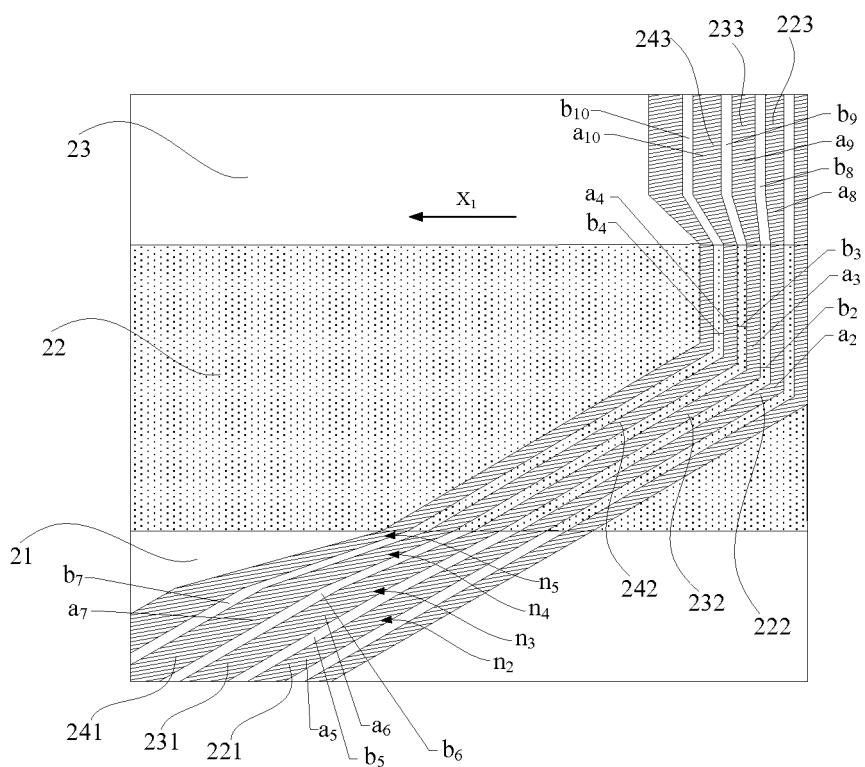
FIG. 4 is a schematic diagram showing a wiring structure of the display panel according to a first embodiment of the present invention.

Specifically, please refer to FIG. 4. FIG. 4 is a schematic diagram showing a wiring structure of the display panel according to a first embodiment of the present invention.

In the present embodiment, n is taken as four different values 2, 3, 4, and 5 for illustration. Namely, a second metal wire $n_2$, a third metal wire $n_3$, a fourth metal wire $n_4$, and a fifth metal wire $n_5$ are taken as an example.

The second metal wire $n_2$ comprises a metal wire 221 disposed in the first wiring region 21, a metal wire 222 disposed in the second wiring region 22, and a metal wire 223 disposed in the third wiring region 23. A line width of the second metal wire $n_2$ in the second wiring region 22 is $a_2$, and a distance between the second metal wire $n_2$ and the third metal wire $n_3$ is $b_2$.

The third metal wire $n_3$ comprises a metal wire 231 disposed in the first wiring a region 21, a metal wire 232 disposed in the second wiring region 22, and a metal wire 233 disposed in the third wiring region 23. A line width of the third metal wire $n_3$ in the second wiring region 22 is $a_3$, and a distance between the third metal wire $n_3$ and the fourth metal wire $n_4$ is $b_3$.

The fourth metal wire $n_4$ comprises a metal wire 241 disposed in the first wing region 21, a metal wire 242 disposed in the second wiring region 22, and a metal wire 243 disposed in the third wiring region 23. A line width of the fourth metal wire $n_4$ in the second wiring region 22 is $a_4$, and a distance between the fourth metal wire $n_4$ and the fifth metal wire $n_5$ is $b_4$.

Where $a_2=a_3=a_4$ and $b_2=b_3=b_4$, then $a_2/(a_2+b_2)=a_3/(a_3+b_3)=a_4/(a_4+b_4)$.

Furthermore, a line width of the second metal wire $n_2$ in the first wiring region 21 is $a_5$, and a distance between the second metal wire $n_2$ and the third metal wire $n_3$ is $b_5$. A line width of the third metal wire $n_3$ in the first wiring region 21 is $a_6$, and a distance between the third metal wire $n_3$ and the fourth metal wire $n_4$ is $b_6$. A line width of the fourth metal wire $n_4$ in the first wiring region 21 is $a_7$, and a distance between the fourth metal wire $n_4$ and the fifth metal wire $n_5$ is $b_7$. Where $b_5=b_6=b_7$ and $a_7>a_6>a_5$.

A line width of the second metal wire $n_2$ in the third wiring region 23 is $a_8$, and a distance between the second metal wire $n_2$ and the third metal wire $n_3$ is $b_8$. A line width of the third metal wire $n_3$ in the third wiring region 23 is $a_9$, and a distance between the third metal wire $n_3$ and the fourth metal wire $n_4$ is $b_9$. A line width of the fourth metal wire $n_4$ in the third wiring region 23 is $a_{10}$, and a distance between the fourth metal wire $n_4$ and the fifth metal wire $n_5$ is $b_{10}$. Where $b_8=b_9=b_{10}$, and $a_{10}>a_9>a_8$.

It is understandable that, even when n is taken as different values, the line width a in the second wiring region 22 remains the same value, and the distance b in the second wiring region 22 also remains the same value. That means, a/(a+b) is a constant value. In the first wiring region 21 and the third wiring region 23, the line width a is increased along an arrangement direction from a first metal wire to a last metal wire (a direction $X_1$ as indicated by the arrow in FIG. 4) as n increases, while the distance b remains the same value as n increases.

Figure 5:
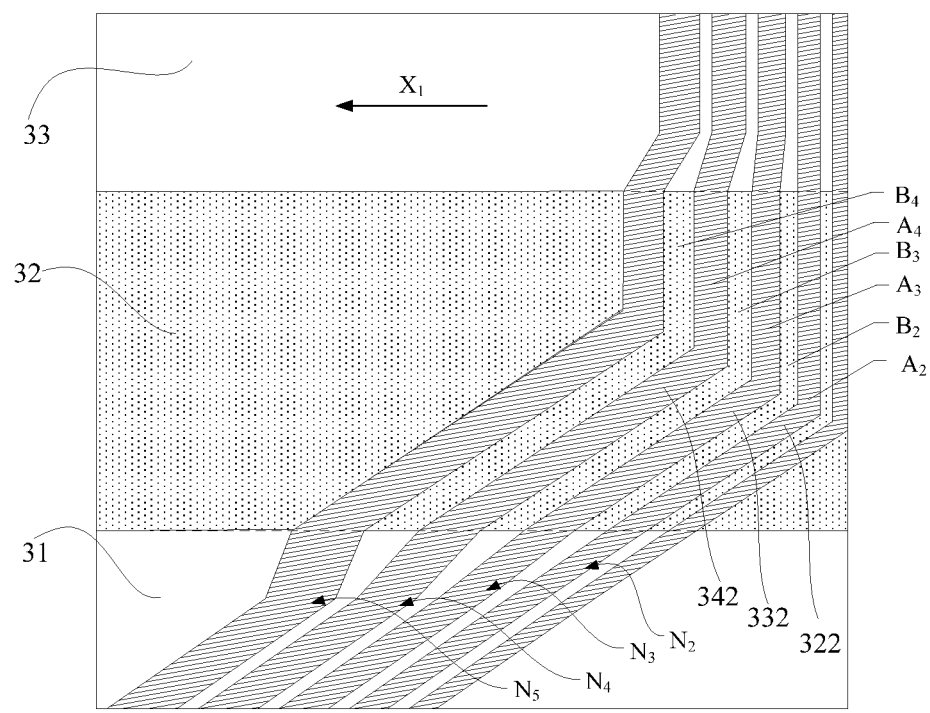
FIG. 5 is a schematic diagram showing a wiring structure of the display panel according to a second embodiment of the present invention.

Please further refer to FIG. 5, FIG. 5 is a schematic diagram showing a wiring structure of the display panel according to a second embodiment of the present invention. In the same way, n is taken as four different values 2, 3, 4, and 5 for illustration in the present embodiment. Namely, a second metal wire $N_2$, a third metal wire $N_3$, a fourth metal wire $N_4$, and a fifth metal wire $N_5$ are taken as an example.

Line widths A and distances B of the second metal wire $N_2$, the third metal wire $N_3$, the fourth metal wire $N_4$, and the fifth metal wire $N_5$ in a first wiring region 31 and in a third wiring region 33 are same as those mentioned above. Hence, there is no need to further elaborate on them.

The main difference between the two embodiments is that the second metal wire $N_2$ comprises a metal wire 322 disposed in the second wiring region 32, a line width of the metal wire 322 is $A_2$, and a distance between the second metal wire $N_2$ and the third metal wire $N_3$ is $B_2$; the third metal wire $N_3$ comprises a metal wire 332 disposed in the second wiring region 32, a line width of the metal wire 332 is $A_3$, and a distance between the third metal wire $N_3$ and the fourth metal wire $N_4$ is $B_3$; the fourth metal wire $N_4$ comprises a metal wire 342 disposed in the second wiring region 32, a line width of the metal wire 342 is $A_4$, and a distance between the fourth metal wire $N_4$ and the fifth metal wire $N_5$ is $B_4$.

Where $A_4=m*A_3$, $A_3=m*A_2$, $B_4=m*B_3$, and $B_3=m*B_2$, where m is a positive number. Since $A_4/(A_4+B_4)=m*A_3/(m*A_3+m*B_3)=A_3/(A_3+B_3)$ and $A_3/(A_3+B_3)=m*A_2/(m*A_2+m*B_2)=A_2/(A_2+B_2)$, then $A_2/(A_2+B_2)=A_3/(A_3+B_3)=A_4/(A_4+B_4)$. From the above equations, both the value of the line width A and the value of the distance B in the second wiring region 32 change in equal proportion when N is taken as different values.

When m is taken as greater than or equal to 1, the value of the line width A and the value of the distance B in the second wiring region 32 increase in a first direction along which a first metal wire to a last metal wire arrange (a direction $X_1$ as a indicated by the arrow in FIG. 5) in equal proportion.

When m is greater than 0 and less than 1, the value of the line width A and the value of the distance B in the second wiring region 32 decrease in the first direction along which the first metal wire to the last metal wire arrange (the direction $X_1$ as indicated by the arrow in FIG. 5) in equal proportion. In other words, the value of the line width A and the value of the distance B in the second wiring region 32 increase in a second direction along which the last metal wire to the first metal wire arrange (a direction opposite to the direction $X_1$ as indicated by the arrow in FIG. 5) equal proportion.

In the present embodiment, the proportion is preferably 1:1. In other embodiments, other proportions may be adapted, for example, 1:0.8 or 2:1. Any specific requirements are determined according to the practical situations.

In summary, the present invention display panel and its wiring structure are achieved by keeping a/(a+b) a constant value, where a is the line width of each of the metal wires and b is the distance between the adjacent metal wires in the seal coating region of the display panel. Therefore, the coverage ratio in the seal coating region by the metal wires is not changed to avoid the problem of uneven curing of the sealant. As a result, the performance stability of the display panel is improved so as to effectively improve the display quality.

Those skilled in the art will readily observe that numerous modifications and alterations of the device and method may be made while retaining the teachings of the invention. Accordingly, the above disclosure should be construed as limited only by the metes and hounds of the appended claims.

What is claimed is:

1. A wiring structure of a display panel, comprising:
a plurality of metal wires extending across a first wiring region, a second wiring a region, and a third wiring region, the first wiring region adjoining the second wiring region, and the second wiring region adjoining the third wiring region;
wherein the first wiring region is located inside the second wiring region, the third wiring region is located outside the second wiring region, the second wiring region is a seal coating region of the display panel, a line width of an nth metal wire in the second wiring region is a, a distance between the nth metal wire and an n+1th metal wire is b, where n≥1, and a/(a+b) is a constant value when n is taken as different values;
wherein both the value of the line width a and the value of the distance b in the second region change in equal proportion;
wherein a percentage difference between impedance values of the two adjacent metal wires is no more than 10%.

2. The wiring structure as claimed in claim 1, wherein the line width a is increased along an arrangement direction from a first metal wire to a last metal wire in the first wiring region and the third wiring region as n increases, and the distance b remains the same value in the first wiring region and the third wiring region as n increases.

3. A wiring structure of a display panel, comprising:
a plurality of metal wires extending across a first wiring region, a second wiring region, and a third wiring region, the first wiring region adjoining the second wiring region, and the second wiring region adjoining the third wiring region;
wherein the first wiring region is located inside the second wiring region, the third wiring region is located outside the second wiring region, the second wiring region is a seal coating region of the display panel, a line width of an nth metal wire in the second wiring region is a, a distance between the nth metal wire and an n+1th metal wire is b, where n≥1, and a/(a+b) is a constant value when n is taken as different values.

4. The wiring structure as claimed in claim 3, wherein the line width a and the distance b in the second region are both constant values when n is taken as different values.

5. The wiring structure as claimed in claim 3, wherein both the value of the line width a and the value of the distance b in the second region change in equal proportion when n is taken as different values.

6. The wiring structure as claimed in claim 5, wherein both the value of the line width a and the value of the distance b increase in a first direction along which a first metal wire to a last metal wire arrange in equal proportion.

7. The wiring structure as claimed in claim 6, wherein the proportion is 1:1.

8. The wiring structure as claimed in claim 5, wherein both the value of the line width a and the value of the distance b decrease in a second direction along which a last metal wire to a first metal wire arrange in equal proportion.

9. The wiring structure as claimed in claim 8, wherein the proportion is 1:1.

10. The wiring structure as claimed in claim 3, wherein a percentage difference between impedance values of the two adjacent metal wires is no more than 10%.

11. The wiring structure as claimed in claim 3, wherein the line width a is increased along an arrangement direction from a first metal wire to a last metal wire in the first wiring region and the third wiring region as n increases, and the distance b remains the same value in the first wiring region and the third wiring region as n increases.

12. A display panel, comprising a wiring structure disposed in the display panel, the wiring structure comprising:

a plurality of metal wires extending across a first wiring region, a second wiring region, and a third wiring region, the first wiring region adjoining the second wiring region, and the second wiring region adjoining the third wiring region;

wherein the first wiring region is located inside the second wiring region, the third wiring region is located outside the second wiring region, the second wiring region is a seal coating region of the display panel, a line width of an nth metal wire a in the second wiring region is a, a distance between the nth metal wire and an n+1th metal wire is b, where n≥1, and a/(a+b) is a constant value when n is taken as different values.

13. The display panel as claimed in claim 12, wherein the line width a and the distance b in the second region are both constant values when n is taken as different values.

14. The display panel as claimed in claim 12, wherein both the value of the line width a and the value of the distance b in the second region change in equal proportion when N is taken as different values.

15. The display panel as claimed in claim 14, wherein both the value of the line width a and the value of the distance b increase in a first direction along which a first metal wire to a last metal wire arrange in equal proportion.

16. The display panel as claimed in claim 15, wherein the proportion is 1:1.

17. The display panel as claimed in claim 14, wherein both the value of the line width a and the value of the distance b decrease in a second direction along which a last metal wire to a first metal wire arrange in equal proportion.

18. The display panel as claimed in claim 17, wherein the proportion is 1:1.

19. The display panel as claimed in claim 12, wherein a percentage difference between impedance values of the two adjacent metal wires is no more than 10%.

20. The display panel as claimed in claim 12, wherein the line width a is increased along an arrangement direction from a first metal wire to a last metal wire in the first wiring region and the third wiring region as n increases, and the distance b remains the same value in the first wiring region and the third wiring region as n increases.

\* \* \* \* \*